United States Patent
Bostak et al.

(10) Patent No.: US 7,091,796 B2
(45) Date of Patent: * Aug. 15, 2006

(54) METHOD AND SYSTEM FOR CALIBRATION OF A VOLTAGE CONTROLLED OSCILLATOR (VCO)

(75) Inventors: Christopher J. Bostak, Fort Collins, CO (US); Samuel D. Naffziger, Fort Collins, CO (US); Christopher A. Poirier, Fort Collins, CO (US); James S. Ignowski, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 67 days.

This patent is subject to a terminal disclaimer.

(21) Appl. No.: 10/644,559

(22) Filed: Aug. 20, 2003

(65) Prior Publication Data

US 2005/0040900 A1    Feb. 24, 2005

(51) Int. Cl.
*H03B 5/04* (2006.01)
(52) U.S. Cl. ......................... 331/44; 331/185
(58) Field of Classification Search ................. 331/44, 331/14, 16, 34, 1 A, 185; 327/156, 159, 327/160

See application file for complete search history.

(56) References Cited

U.S. PATENT DOCUMENTS 4,119,902 A * 10/1978 Newell ..................... 318/696
4,746,879 A * 5/1988 Ma et al. ..................... 331/44
5,179,725 A   1/1993 Camp, Jr. et al.
5,229,700 A * 7/1993 Stitt et al. .................. 318/618
5,995,032 A  11/1999 Gandy
5,999,060 A * 12/1999 Zuta ............................ 331/14
6,222,370 B1 * 4/2001 Schousek et al. .......... 324/436
6,512,419 B1   1/2003 Adams et al.
6,954,706 B1 * 10/2005 Poirier et al. ................. 702/65
2002/0075080 A1  6/2002 Nelson et al.

FOREIGN PATENT DOCUMENTS

DE         36 17936       12/1987
DE        101 36 939       2/2003

OTHER PUBLICATIONS

Office Action from German Patent Application 10 2004 018 635.9-35 dated Apr. 4, 2006 (English translation provided).

* cited by examiner

*Primary Examiner*—Joseph Chang

(57) ABSTRACT

A method for calibrating a voltage controlled oscillator (VCO) comprising applying a plurality of known voltages to the input of a VCO, monitoring, for each of the voltages, an output count from the VCO over a set interval, and storing the output counts for each voltage. Also disclosed is a system for calibrating a voltage controlled oscillator (VCO) comprising a plurality of known voltages, wherein the known voltage are connectable to the VCO, and a controller coupled to the output of the VCO, wherein the controller maintains a calibration table of VCO output counts for selected voltage inputs.

14 Claims, 2 Drawing Sheets

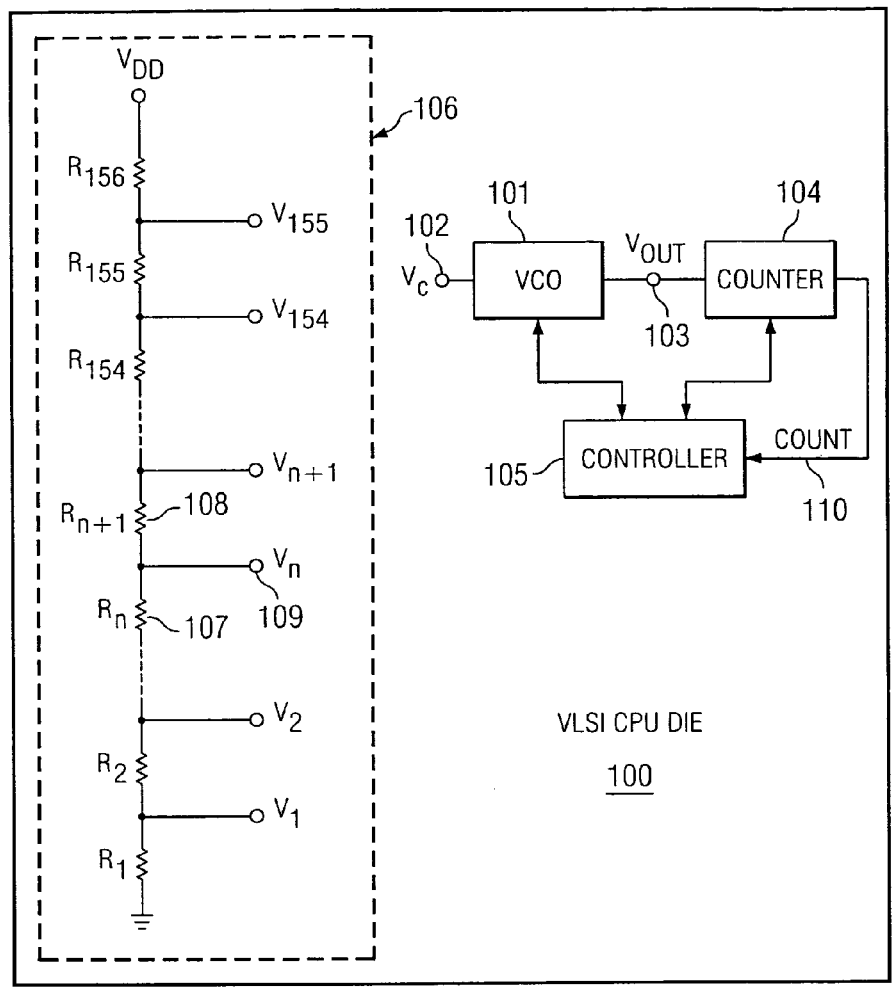

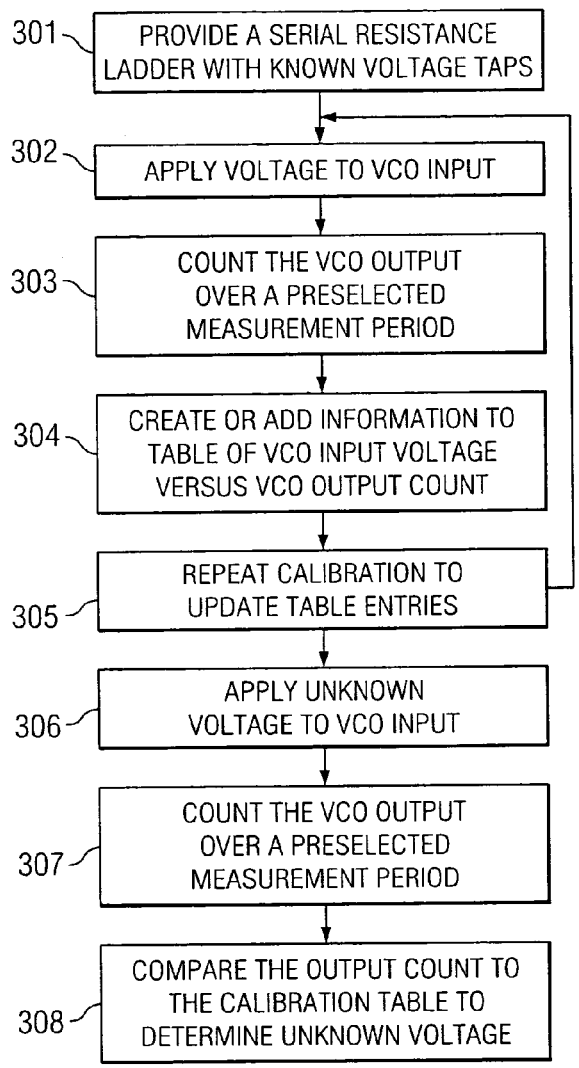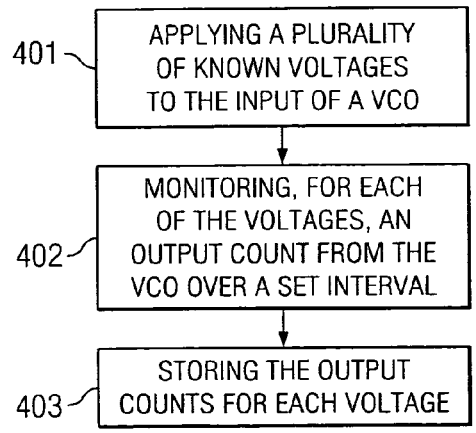

METHOD AND SYSTEM FOR CALIBRATION OF A VOLTAGE CONTROLLED OSCILLATOR (VCO)

CROSS-REFERENCE TO RELATED APPLICATIONS

This application is related to U.S. patent application Ser. No. 10/644,542, entitled "SYSTEM AND METHOD FOR MEASURING CURRENT;" U.S. patent application Ser. No. 10/644,625, entitled "A SYSTEM FOR AND METHOD OF CONTROLLING A VLSI ENVIRONMENT;" and U.S. Pat. No. 6,954,706, entitled "A METHOD FOR MEASURING INTEGRATED CIRCUIT PROCESSOR POWER DEMAND AND ASSOCIATED SYSTEM," filed concurrently herewith, the disclosures of which are hereby incorporated by reference herein in their entirety.

BACKGROUND

In order to optimize the operating conditions of an integrated circuit, such as a microprocessor, it is often desirable to measure the current used by the circuit. The standard method for measuring a current is to send the current through a sense resistor of known value while measuring the voltage drop across the resistor. From the known resistance and the measured voltage, one may calculate the current load using Ohm's law (I=V/R).

It is important to get an accurate voltage measurement so that the current can be precisely measured. One method of measuring voltage in a digital circuit uses a voltage controlled oscillator (VCO). When a voltage to be measured is applied to the control input of the VCO, the output of the VCO produces a series of pulses. A counter can be coupled to the VCO output and may count the VCO output pulses for a fixed interval. The VCO output frequency can then be correlated to a known input voltage, thereby determining the value of the unknown input voltage. However, the accuracy of this method may vary because the voltage versus frequency relationship for the VCO is not linear. The gain of the VCO may vary with voltage, temperature, age and other parameters. Therefore, the output count for a particular input voltage will vary for different operating conditions.

SUMMARY

One embodiment of the invention includes a method for calibrating a voltage controlled oscillator (VCO) comprising providing a plurality of known voltages, applying the known voltages to the input of a VCO, monitoring, for each of the voltages, an output count from the VCO over a set interval, and storing the output counts for each voltage.

Another embodiment of the invention includes a system for calibrating a voltage controlled oscillator comprising a plurality of known voltages, wherein the known voltage are connectable to the VCO, and a controller coupled to the output of the VCO, wherein the controller maintains a calibration table of VCO output counts for selected voltage inputs.

Another embodiment of the invention includes a computer program product comprising a computer usable medium having computer readable program code embedded therein, the computer readable program code comprising code for providing a plurality of known voltages, code for applying the known voltages to each of the VCOs, code for monitoring an output count from the VCO over a set period, and code for storing, for each VCO, a table of output counts for each voltage.

Another embodiment of the invention is a system for calibrating a voltage controlled oscillator (VCO) comprising means for applying a plurality of known voltages to the input of a VCO, means for monitoring, for each of the voltages, an output count from the VCO over a set interval, and means for storing the output counts for each voltage.

BRIEF DESCRIPTION OF THE DRAWINGS

FIG. 1 is a block diagram illustrating an embodiment of the present invention;

FIG. 2 is an exemplary calibration table according to embodiments of the invention;

FIG. 3 is a flowchart illustrating a process for calibrating a VCO; and

FIG. 4 is a flowchart illustrating an alternative process for calibrating a VCO.

DETAILED DESCRIPTION

Some embodiments of the invention generate tables that relate VCO input voltages to VCO output counts. The table may then be used to determine unknown input voltages using the output counts. Using an on-die, stable voltage source and a set of matched, on-die resistors, a range of known precision voltages may be generated. The VCO control input can be connected to these voltages. A unique output count is generated for each input. The VCO is allowed to run for a fixed time interval at each voltage input. A counter counts the VCO output frequency during that time interval. At the end of each time interval, the values of the known input voltage and the output count are entered into a calibration table. The input voltage is swept across a range of input voltages and the calibration table is completed for a range of voltages.

The VCO is susceptible to temperature and voltage variations, so the calibration table may be updated continuously to reflect the current operating conditions of the device. The calibration table can also be used to determine the voltage drop across a known resistance as part of a current measurement.

FIG. 1 is a block diagram illustrating an embodiment of the present invention. Components of a processor, such as CPU cores, monitoring circuits and micro-controllers (not shown), may be constructed as integrated circuits on VLSI CPU die 100. Components used in embodiments of the invention are also constructed on the same VLSI CPU die 100. VCO 101 is an integrated voltage controlled oscillator, which may be constructed using any now known or later developed techniques. When a voltage is applied to control input 102, VCO 101 generates output pulses at output 103. Counter 104 may be coupled to output 103 to count the pulses from VCO 101. As input voltage 102 varies, the output count at output 110 varies proportionally. For example, increases in voltage 102 cause the frequency to increase at output 103 and the count to increase at 110.

Controller 105 may be an on-die microprocessor that selects the input voltage for VCO 101 and that monitors the count value on counter 104. Controller 105 builds a calibration table for VCO 101 using the known voltage inputs.

Resistor ladder 106 may be constructed on VLSI CPU die 100. Resistor ladder 106 may comprise 156 matched resistors connected in series between a known voltage and ground. The voltage drop across each resistor is identical thereby creating a string of evenly spaced, known voltage taps $V_n$ 109 between each pair of resistors $R_n$ 107, $R_{n+1}$ 108.

It will be understood that other voltage sources that produce reliable known voltages may also be used.

One or more of the known voltages $V_n$ are applied to input 102 on VCO 101. Counter 104 monitors output 103 and measures the count 110 over a set time interval for each known voltage. Controller 105 builds a table of known voltages mapped to output counts for VCO 101.

FIG. 2 is an exemplary calibration table 200. Voltage inputs 201 are the known voltage values from resistance ladder 106. Output counts 202 are the respective counts that are generated for each of the input voltages. Output counts 202 represent a number of pulses counted over a predetermined interval of time. Alternatively, output count 202 may be a count measured at output 110 for each control voltage 201. Although calibration table 200 uses each voltage from ladder 106, in other embodiments only a subset of these voltages are used for calibration. For example, only voltages from an anticipated operating range of input voltages for VCO 101 may be used to generate table 200.

Table 200 reflects the output count for known voltages under the operating conditions for VCO 101 at the time the counts are made. As conditions vary, such as a change in temperature, the output counts for each input voltage may also vary. Therefore, controller 105 may continually update table 200 to reflect the current operating conditions of VCO 101.

Once table 200 has been generated, an unknown voltage can be applied to input 102. The VCO output is monitored for the unknown voltage and counted for the same predetermined period of time. The count is then compared to column 202 in calibration table 200 and is matched to the closest calibration count. The value of the unknown input voltage is determined to be the respective voltage in column 201. For example, if an unknown voltage generates a count equivalent to $Count_n$ 203, then the unknown voltage is determined to be equivalent to voltage $V_n$ 204. It will be understood that interpolation or other functions may be used to determine the unknown input voltage when the output count falls between two values in column 202.

FIG. 3 is a flowchart illustrating process 300 for calibrating a VCO. In 301, a serial resistance ladder is provided with known voltage taps. These voltage taps may be evenly spaced voltages between a series of resistors of the same value, for example. One of the known voltages is applied to a VCO control input in 302. The input voltage causes the VCO to output a series of pulses. Those pulses are counted over an interval of time in 303. The pulse count is added to a table in 304. The table maps known input voltages to measured output counts. In 305, the process is repeated for other voltages so that the calibration table can be filled for all available known voltages or for voltages in a selected operating range. Once the table is filled for all of the selected voltages, the process may be repeated again for each known voltage to update the count values to reflect current operating conditions.

In 306, an unknown voltage is applied to the VCO input. The output of the VCO may be monitored and, in 307, counted over a predetermined interval. The count is compared to the calibration table in 308 and is correlated to a known voltage.

FIG. 4 is a flowchart illustrating a process for calibrating a VCO. In 401, a plurality of known voltages are applied to the input of a VCO. In 402, the output count from each of the VCOs is monitored over a set interval. In 403, the output counts for each voltage are stored.

What is claimed is:

1. A method for calibrating a voltage controlled oscillator (VCO) comprising:
   providing a serial resistance ladder having a plurality of equal resistors;
   applying a plurality of known voltages to the input of a VCO, wherein the known voltages are available from between each of the resistors;
   monitoring, for each of the voltages, an output count from the VCO over a set interval; and storing the output counts for each voltage.

2. The method of claim 1 wherein the serial resistance ladder and the VCO are constructed on the same integrated circuit.

3. The method of claim 1 further comprising:
   interleaving a VCO calibration cycle in which known input voltages are substituted for measurements of unknown input voltages.

4. The method of claim 1 further comprising:
   repeating calibration operations for the same known input voltage at periodic intervals to compensate for variations in operating conditions.

5. The method of claim 1 further comprising:
   applying an unknown voltage to the VCO input;
   monitoring an unknown output count from the VCO over a set interval; and
   comparing the unknown output count to a table of stored output counts.

6. The method of claim 5 wherein the unknown voltage is measured across a sense resistor with a known resistance, and further comprising:
   determining the value of the unknown voltage by relating it to a known voltage that has an equivalent output count; and
   calculating a current through the sense resistor using the known resistance and a value determined for the unknown voltage.

7. A system for calibrating a voltage controlled oscillator (VCO) comprising:
   a plurality of known voltages, wherein the known voltage are connectable to the VCO; and
   a controller coupled to the output of the VCO, wherein the controller maintains a calibration table of VCO output counts, monitored over a set interval, for selected voltage inputs; and
   a resistance ladder having a plurality of voltage taps, wherein the voltage taps provide the known voltages.

8. The system of claim 7 wherein the VCO, the resistance ladder and the controller are constructed on the same integrated circuit.

9. The system of claim 7 further comprising:
   a plurality of VCOs; and
   wherein the controller maintains a separate calibration table for each of the VCOs.

10. A computer program product comprising a computer usable medium having computer readable program code embedded therein, the computer readable program code comprising:
    code for selecting a voltage to be applied to inputs of a plurality of voltage controlled oscillators (VCOs), wherein the voltage is selected from one of a plurality of voltage taps on a serial resistance ladder, wherein the voltage taps provide known voltages;
    code for monitoring output counts from each of the plurality of VCOs over a set period of time, while the selected voltage is applied to the VCOs' inputs; and code for storing, for each of the plurality of VCOs, a table of output counts associated with the selected voltage.

11. The computer program product of claim 10 further comprising: code for interleaving a VCO calibration cycle during which with other VCO measurements.

12. A system for calibrating a voltage controlled oscillator (VCO) comprising:
- means for applying a plurality of known voltages to the input of a VCO;
- means for monitoring, for each of the voltages, an output count from the VCO over a set interval;
- means for storing the output counts for each voltage;
- means for applying an unknown voltage to the VCO input, wherein the unknown voltage is measured across a sense resistor with a known resistance;
- means for monitoring an unknown output count from the VCO over a set interval; and
- means for determining the value of the unknown voltage by relating it to a known voltage that has an equivalent output count; and
- means for calculating a current through the sense resistor using the known resistance and a value determined for the unknown voltage.

13. The system of claim 12 further comprising:
- means for interleaving a VCO calibration cycle in which known input voltages are substituted for measurements of unknown input voltages.

14. The system of claim 12 further comprising: means for repeating calibration operations for the same known input voltage at periodic intervals to compensate for variations in operating conditions.

* * * * *